(12) United States Patent
Guo et al.

(10) Patent No.: US 10,141,423 B2
(45) Date of Patent: Nov. 27, 2018

(54) THIN FILM TRANSISTOR AND FABRICATION METHOD THEREOF, ARRAY SUBSTRATE AND FABRICATION METHOD THEREOF, DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Huibin Guo, Beijing (CN); Xiaoxiang Zhang, Beijing (CN); Jing Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/527,410

(22) PCT Filed: Jul. 1, 2016

(86) PCT No.: PCT/CN2016/088071
§ 371 (c)(1),
(2) Date: May 17, 2017

(87) PCT Pub. No.: WO2017/152552
PCT Pub. Date: Sep. 14, 2017

(65) Prior Publication Data
US 2018/0108756 A1 Apr. 19, 2018

(30) Foreign Application Priority Data

Mar. 9, 2016 (CN) .......................... 2016 1 0133484

(51) Int. Cl.
*H01L 29/66* (2006.01)
*H01L 21/027* (2006.01)
*H01L 29/786* (2006.01)

(52) U.S. Cl.
CPC .... *H01L 29/66742* (2013.01); *H01L 21/0274* (2013.01); *H01L 29/78606* (2013.01)

(58) Field of Classification Search
None
See application file for complete search history.

(56) References Cited

U.S. PATENT DOCUMENTS

| 8,586,406 B1 | 11/2013 | Wu |
| 9,024,318 B2 | 5/2015 | Lee |

(Continued)

FOREIGN PATENT DOCUMENTS

| CN | 102646632 A | 8/2012 |
| CN | 102779784 A | 11/2012 |

(Continued)

OTHER PUBLICATIONS

International Search Report dated Dec. 15, 2016 issued in corresponding International Application No. PCT/CN2016/088071 along with an English translation of the Written Opinion of the International Searching Authority.

(Continued)

*Primary Examiner* — Michelle Mandala
(74) *Attorney, Agent, or Firm* — Nath, Goldberg & Meyer; Joshua B. Goldberg (57) ABSTRACT

The disclosure provides a thin film transistor (TFT) and a fabrication method thereof, an array substrate and a fabrication method thereof, and a display apparatus. The fabrication method of a TFT includes: forming a protection layer in an area on an active layer between a source electrode and a drain electrode to be formed, forming a source-drain metal layer above the active layer having the protection layer formed thereon, coating a photoresist on the source-drain metal layer, and forming a photoresist reserved area corresponding to areas of the source electrode and the drain electrode to be formed and a photoresist non-reserved area corresponding to the other area; etching off the source-drain metal layer corresponding to the photoresist non-reserved area to form the source and drain electrodes and expose the (Continued)

protection layer above the active layer; and removing the photoresist above the source and drain electrodes and the protection layer.

17 Claims, 4 Drawing Sheets

(56) References Cited

U.S. PATENT DOCUMENTS

| | | | |
|---|---|---|---|
| 9,368,635 B2 | 6/2016 | Dai et al. | |
| 2014/0080254 A1* | 3/2014 | Yoo | H01L 29/7869 438/104 |
| 2016/0133729 A1* | 5/2016 | Xu | H01L 29/45 438/104 |
| 2016/0313622 A1 | 10/2016 | Duan et al. | |

FOREIGN PATENT DOCUMENTS

| | | |
|---|---|---|
| CN | 103441100 A | 12/2013 |
| CN | 104319278 A | 1/2015 |
| CN | 105161541 A | 12/2015 |

OTHER PUBLICATIONS

First Office Action dated Mar. 28, 2018 corresponding to Chinese application No. 201610133484.6.

* cited by examiner

THIN FILM TRANSISTOR AND FABRICATION METHOD THEREOF, ARRAY SUBSTRATE AND FABRICATION METHOD THEREOF, DISPLAY APPARATUS

This is a National Phase Application filed under 35 U.S.C. 371 as a national stage of PCT/CN2016/088071, filed Jul. 1, 2016, an application claiming the benefit of Chinese Application No. 201610133484.6, filed Mar. 9, 2016, the content of each of which is hereby incorporated by reference in its entirety.

TECHNICAL FIELD

The present invention relates to the field of liquid crystal display technology, and particularly relates to a thin film transistor, an array substrate, a display apparatus, a fabrication method of a thin film transistor and a fabrication method of an array substrate.

BACKGROUND

With the development of liquid crystal technology, thin film transistor liquid crystal displays (TFT-LCDs), which have high quality, low power consumption and no radiation, have become the mainstream of the market.

In fabrication of a thin film transistor (TFT), in order to avoid an etchant from corroding an area of an active layer corresponding to a channel when etching a source-drain metal between a source electrode and a drain electrode, the following method is generally adopted in the prior art: when removing a first photoresist layer above the active layer, reserving the photoresist above the area corresponding to the channel; then, after a source-drain metal layer is formed, coating a second photoresist layer above the source-drain metal layer, and reserving the photoresist above areas of the source-drain metal layer corresponding to the source electrode and the drain electrode and the photoresist above the area corresponding to the channel so that the reserved photoresist above the active layer can protect the active layer from being corroded when etching the source-drain metal layer; and finally, simultaneously removing the photoresist above the areas of the source-drain metal layer corresponding to the source electrode and the drain electrode, the photoresist in the second photoresist layer above the area corresponding to the channel and the photoresist in the first photoresist layer above the area corresponding to the channel.

This method, however, has one problem as follows: since the photoresist in the first photoresist layer above the active layer is covered by a film layer such as the source-drain metal layer, problems such as incomplete removal of photoresist are apt to occur in the final process of removing the photoresist, which affects characteristics of the TFT.

SUMMARY

An object of the present invention is to provide a TFT and a fabrication method thereof, an array substrate and a fabrication method thereof, and a display apparatus, in order to solve the problem that characteristics of the TFT are affected by incomplete removal of the photoresist resulting from the presence of the source-drain metal layer when removing the photoresist reserved above the active layer.

Embodiments of the present invention provide a fabrication method of a TFT including steps of: forming a protection layer in an area on an active layer between a source electrode and a drain electrode to be formed; forming a source-drain metal layer above the active layer having the protection layer formed thereon; coating a photoresist on the source-drain metal layer, and forming a photoresist reserved area and a photoresist non-reserved area, wherein the photoresist reserved area corresponds to areas of the source electrode and the drain electrode to be formed, and the photoresist non-reserved area corresponds to the other area; etching off the source-drain metal layer corresponding to the photoresist non-reserved area to form the source electrode and the drain electrode and expose the protection layer on the active layer; and removing the photoresist above the source electrode and the drain electrode and the protection layer.

The protection layer may be a positive photoresist or a negative photoresist.

A thickness of the protection layer may range from 3000 Å to 4500 Å.

The thickness of the protection layer may be 4000 Å.

The fabrication method may further include, before the step of forming the protection layer, a step of forming the active layer, and the step of forming the active layer may include steps of: forming a semiconductor layer; coating a photoresist on the semiconductor layer, and forming a photoresist completely-reserved area, a photoresist partially-reserved area and a photoresist non-reserved area, wherein the photoresist completely-reserved area corresponds to an area between the source electrode and the drain electrode to be formed, the photoresist partially-reserved area corresponds to the areas of the source electrode and the drain electrode to be formed above the active layer, and the photoresist non-reserved area corresponds to an area other than an area of the active layer; etching the semiconductor layer corresponding to the photoresist non-reserved area by an etching process; and removing the photoresist in the photoresist partially-reserved area by an ashing process.

The fabrication method may further include a step of forming an ohmic contact layer on the active layer.

The fabrication method may further include a step of sequentially forming a gate electrode and a gate insulation layer before the step of forming the active layer.

Embodiments of the present invention further provide a TFT, which is fabricated according to the above fabrication method.

Embodiments of the present invention further provide a fabrication method of an array substrate including any one of the above fabrication methods.

The fabrication method may further include, before the step of forming the active layer, a step of: sequentially forming a gate electrode and a gate insulation layer. The fabrication method may further include, after the step of removing the photoresist above the source electrode and the drain electrode and the protection layer, steps of: forming a passivation layer on the source electrode and the drain electrode, and forming a first conductive layer on the passivation layer.

A second conductive layer may be formed at the same time when the gate electrode is formed.

Embodiments of the present invention further provide an array substrate fabricated according to the above fabrication method.

Embodiments of the present invention further provide a display apparatus including the above array substrate.

In the above technical solutions, a photoresist reserved area corresponding to areas of the source electrode and the drain electrode to be formed and a photoresist non-reserved area corresponding to a channel area between the source electrode and the drain electrode to be formed and other area are formed when exposing the photoresist above the source-drain metal layer, then at the same time when the source-drain metal layer is etched, metal above the channel area is etched to expose the photoresist having a certain thickness reserved above the active layer, and in a subsequent process of removing the photoresist, the photoresist can be removed completely without residual since no other film layer covers the photoresist, and thus, the characteristics of the TFT will not be affected.

DETAILED DESCRIPTION

Specific implementations of the present invention will be further described in detail below in conjunction with the accompanying drawings and embodiments. The following embodiments are used for explaining the principle of the present invention, rather than limiting the scope of the present invention.

Figure 1:
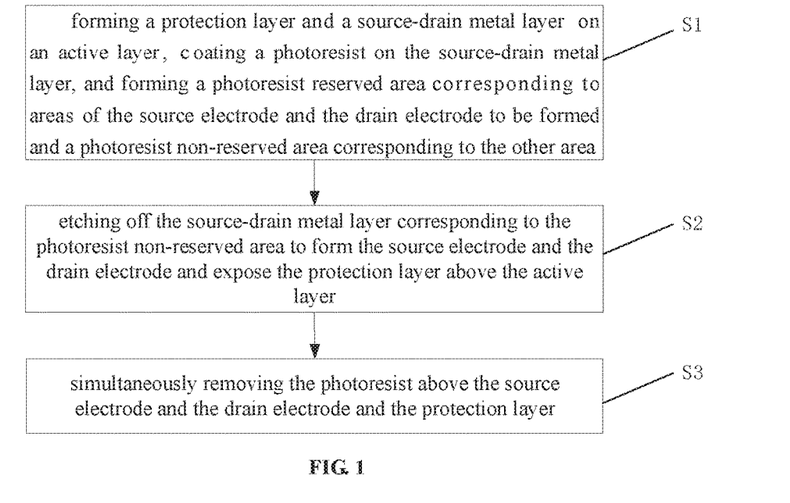
FIG. 1 is a process flow chart according to an embodiment of the present invention.

As shown in FIG. 1, an embodiment of the present invention provides a fabrication method of a thin film transistor (TFT), which includes steps S1 to S3.

Step S1 includes: forming a protection layer in an area above an active layer between a source electrode and a drain electrode to be formed, forming a source-drain metal layer above the active layer having the protection layer formed thereabove, coating a photoresist on the source-drain metal layer, and forming a photoresist reserved area and a photoresist non-reserved area, wherein the photoresist reserved area corresponds to areas of the source and drain electrodes to be formed, and the photoresist non-reserved area corresponds to other area.

Step S2 includes: etching the source-drain metal layer corresponding to the photoresist non-reserved area to form the source and drain electrodes and expose the protection layer above the active layer.

Step S3 includes: removing the photoresist on the source and drain electrodes and the protection layer.

In the embodiment of the present invention, the protection layer can protect an area of the active layer corresponding to a channel when forming the source and drain electrodes through etching, and avoid the area of the active layer corresponding to the channel from being corroded by the etchant to affect characteristics of the TFT. By first etching the material of the area of the source-drain metal layer between the source electrode and the drain electrode to expose the protection layer above the active layer and then removing the photoresist on the source and drain electrodes and the protection layer together, the protection layer can be removed more completely, and influence of the residual material of the protection layer on the characteristics of the TFT is avoided.

Specifically, because a layer of photoresist needs to be coated above a semiconductor layer when forming an active layer, the material of the protection layer may be a photoresist, and in this way, the protection layer can be formed while forming the active layer, which simplifies process and operation, and lowers costs. Needless to say, the protection layer may also be formed by using other material and process, as long as the protection layer can play a role of protecting the active layer, which is not described here. In the embodiments of the present invention, description is given by taking the case where the material of the protection layer is a photoresist as an example.

It needs to be noted that, the photoresist in the embodiments of the present invention may be a positive photoresist or a negative photoresist. After being exposed to light, an irradiated area of the positive photoresist is soluble in the developer. After being exposed to light, an irradiated area of the negative photoresist is insoluble in the developer.

Specifically, the fabrication method of a TFT according to an embodiment of the present invention will be described with reference to FIGS. 2 to 9.

Figure 2:
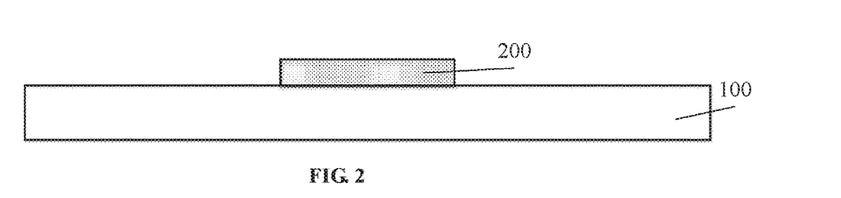
FIG. 2 is a schematic diagram illustrating a process of forming a gate electrode of a thin film transistor according to an embodiment of the present invention.

First, a gate electrode 200 is formed on a base substrate 100.

As shown in FIG. 2, a gate metal layer is formed on the base substrate 100 by a sputtering process, and may be of a single-layer structure or a multi-layer structure. Then, a photoresist is coated, and the gate electrode 200 is formed through processes such as exposure, development, etching and the like.

Figure 3:
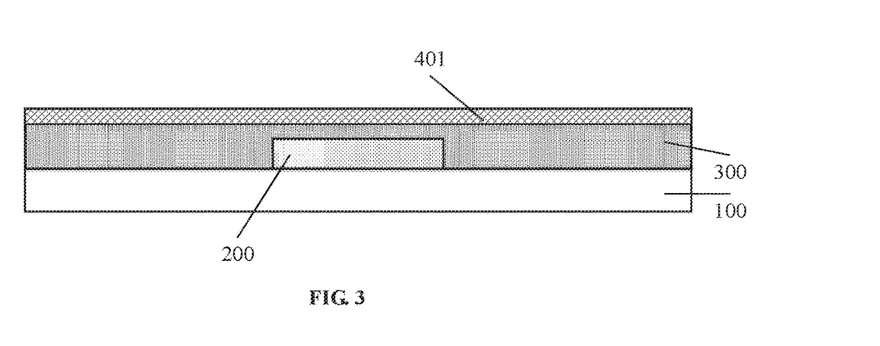
FIGS. 3 to 5 are schematic diagrams illustrating a process of forming an active layer of the thin film transistor according to an embodiment of the present invention.

Next, a gate insulation layer 300 is formed above the gate electrode 200, and an active layer 400 is formed above the gate insulation layer 300.

As shown in FIG. 3, the gate insulation layer 300 is formed above the gate electrode 200 by a plasma enhanced chemical vapor deposition (PECVD) process or an atmospheric chemical vapor deposition (CVD) process; and a semiconductor layer 401 is formed above the gate insulation layer 300 by a sputtering process.

Figure 4:
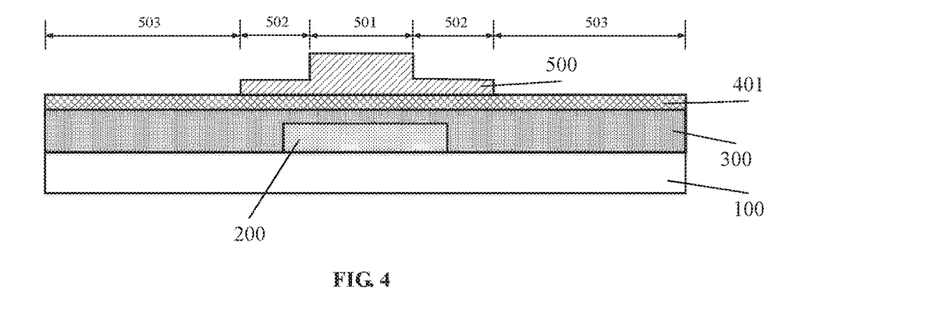

As shown in FIG. 4, a layer of photoresist 500 is coated above the semiconductor layer 401, and is exposed and developed to form a photoresist completely-reserved area 501, a photoresist partially-reserved area 502 and a photoresist non-reserved area 503. The photoresist completely-reserved area 501 corresponds to an area between the source electrode and the drain electrode to be formed, the photoresist partially-reserved area 502 corresponds to areas above the active layer for forming the source and drain electrodes, and the photoresist non-reserved area 503 corresponds to an area other than the area of the active layer.

Figure 5:
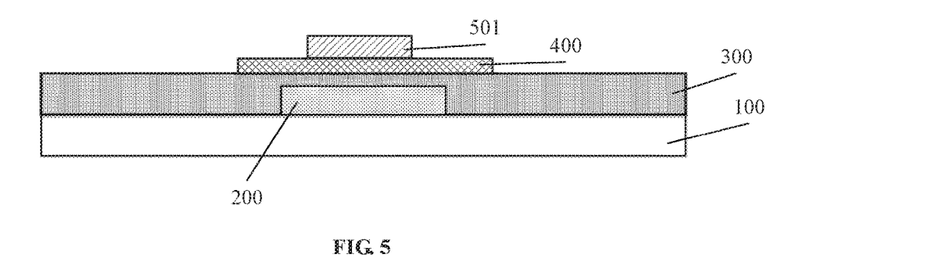

Subsequently, the semiconductor layer corresponding to the photoresist non-reserved area 503 is removed by an etching process, and then the photoresist in the photoresist partially-reserved area 502 is removed by an ashing process or ultraviolet radiation and etching processes to form the active layer 400. At this point, the photoresist in the photoresist completely-reserved area 501 reserved above the active layer 400 may serve as the protection layer of the active layer 400, which can protect the area of the active layer 400 corresponding to the channel from being influenced by the etchant when forming the source and drain electrodes through etching, as shown in FIG. 5.

The principle of the ashing process is as follows: in a closed oxygen environment, let oxygen react with the photoresist under a certain temperature; because the photoresist is an organic matter that reacts easily with oxygen to produce water and carbon dioxide, the thinned thickness of the photoresist can be controlled by precisely controlling time, temperature and oxygen concentration.

The ashing process may reduce the thickness of the photoresist in the photoresist completely-reserved area 501 to a certain extent, and the thickness of the photoresist in the photoresist completely-reserved area 501 subjected to the ashing process, i.e., the thickness of the protection layer, ranges from 3000 Å to 4500 Å. In the case where the thickness of the protection layer is less than 3000 Å, the protection layer is too thin to achieve a good protection result, and thus allows the etchant to corrode the area of the active layer corresponding to the channel to a certain extent when forming the source and drain electrodes through etching. In the case where the thickness of the protection layer is larger than 4500 Å, requirements on the process of removing the protection layer and relevant parameters such as time, temperature, and the like are relatively high, which increases process difficulty. In the case where the thickness of the protection layer is 4000 Å, the active layer can be well protected, and the process difficulty is relatively appropriate.

It needs to be noted that the way of forming the active layer 400 and the protection layer is not limited to the above-described steps. For example, it is also possible to coat a photoresist on an active layer 400 after the active layer 400 is formed, and reserve only the photoresist on the active layer corresponding to the area between the source electrode and the drain electrode by exposure and development processes.

Figure 6:
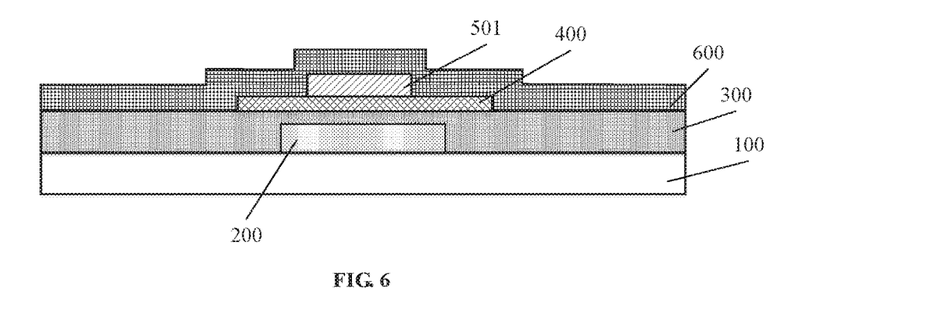
FIGS. 6 to 9 are schematic diagrams illustrating a process of forming a source electrode and a drain electrode of the thin film transistor according to an embodiment of the present invention.

Next, the source and drain electrodes are formed above the active layer 400.

As shown in FIG. 6, after the active layer 400 is formed, a source-drain metal layer 600 is formed by a magnetron sputtering process, a thermal evaporation process or other film forming process, and the source-drain metal layer 600 may be of a single-layer structure or a multi-layer structure.

Figure 7:
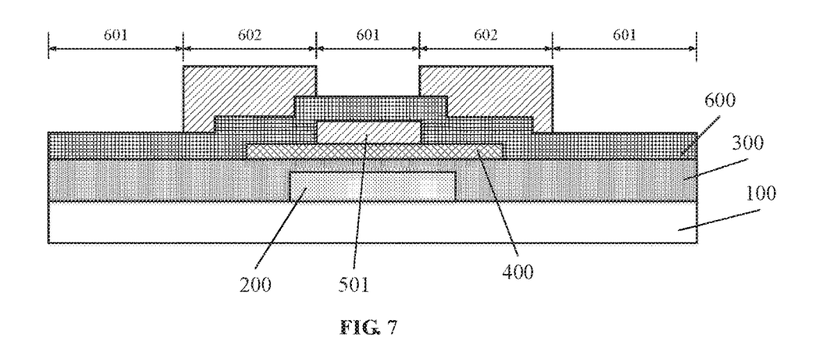

As shown in FIG. 7, a photoresist is coated above the source-drain metal layer 600, and a photoresist reserved area 602 and a photoresist non-reserved area 601 are formed by exposure and development processes. The photoresist reserved area 602 corresponds to areas of the source and drain electrodes to be formed, and the photoresist non-reserved area 601 corresponds to other area.

Figure 8:
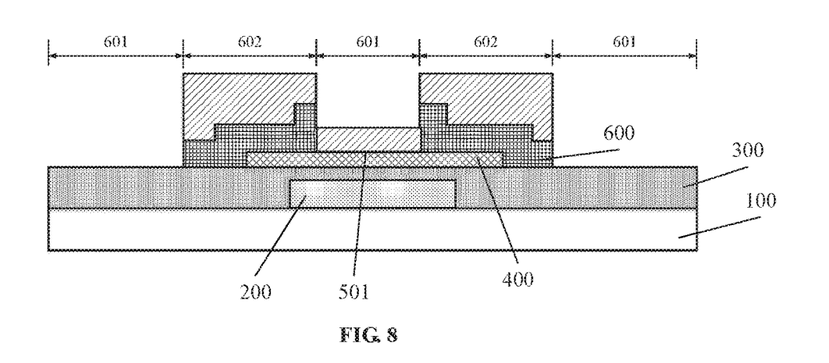

As shown in FIG. 8, the source-drain metal layer corresponding to the photoresist non-reserved area 601 is etched off, and at this point, between the source electrode and the drain electrode, the protection layer 501 above the active layer is exposed.

Figure 9:
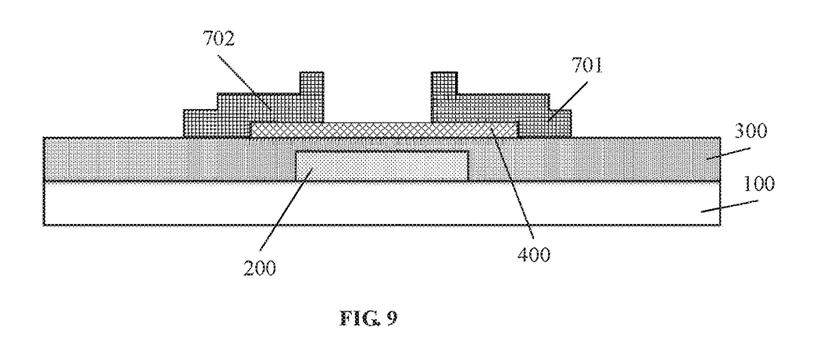

As shown in FIG. 9, the protection layer 501 and the photoresist in the photoresist reserved area 602 above the source-drain metal layer 600 are removed at the same time, so as to form the source electrode 702 and the drain electrode 701. A portion between the source electrode 702 and the drain electrode 701 forms a conductive channel when the TFT is turned on.

From the above, in the fabrication method of a TFT provided in the embodiments of the present invention, a protection layer is formed in an area above the active layer between the source electrode and the drain electrode, and can protect the area of the active layer corresponding to the channel and avoid the active layer from being corroded by the etchant to affect characteristics of the TFT when forming the source and drain electrodes through etching. In addition, when forming the source and drain electrodes, the material of the area of the source-drain metal layer between the source electrode and the drain electrode is etched off first to expose the protection layer above the active layer, and the photoresist above the source and drain electrodes and the protection layer are then removed together, which can allow more complete removal of the protection layer and avoid the residual material of the protection layer from influencing the characteristics of the TFT.

An embodiment of the present invention provides a TFT, which is fabricated according to the above-described fabrication method of a TFT it can be understood that, the TFT can also achieve the above-described technical effect.

An embodiment of the present invention provides a fabrication method of an array substrate, which includes the foregoing fabrication method of a TFT, and further includes: forming a passivation layer above the source and drain electrodes; and forming a first conductive layer above the passivation layer.

Figure 10:
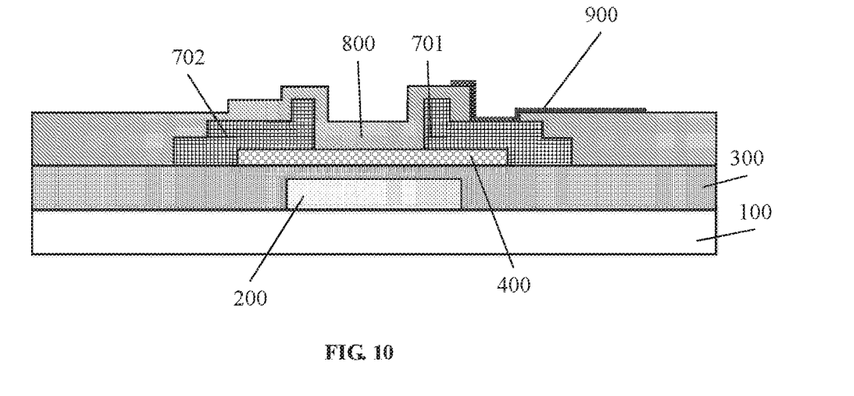
FIG. 10 is a schematic diagram of a structure of an array substrate according to an embodiment of the present invention.

Specifically, as shown in FIG. 10, a passivation layer 800 is formed above the source and drain electrodes by a plasma enhanced chemical vapor deposition (PECVD) process, an atmospheric chemical vapor deposition (CVD) process, a magnetron sputtering process, a thermal evaporation process or other film forming process, and may be made of a material including an oxide, a nitride or an oxynitride, such as SiNx, SiOx, or Si(ON)x. The passivation layer 800 may be of a single-layer structure, or a bilayer structure composed of silicon nitride and silicon oxide.

Subsequently, a patterning process is performed on the passivation layer 800 to form a passivation layer via hole above the drain electrode 701, a transparent conductive layer, which may include ITO or IZO, is deposited above the passivation layer 800 by a magnetron sputtering process, a thermal evaporation process or other film forming process, and the transparent conductive layer is patterned by a patterning process. Specifically, as shown in FIG. 10, the transparent conductive layer forms into a pixel electrode 900 after undergoing the patterning process, and the pixel electrode 900 is electrically connected to the drain electrode 701 through the passivation layer via hole.

From the above, in the fabrication method of an array substrate provided in the embodiments of the present invention, a protection layer is formed in an area above the active layer between the source electrode and the drain electrode, and can protect the area of the active layer corresponding to the channel and avoid the active layer from being corroded by the etchant to affect characteristics of the TFT when forming the source and drain electrodes through etching. In addition, when forming the source and drain electrodes, the material of the area of the source-drain metal layer between the source electrode and the drain electrode is etched off first to expose the protection layer above the active layer, and the photoresist above the source and drain electrodes and the protection layer are then removed together, which can allow more complete removal of the protection layer and avoid the residual material of the protection layer from influencing the characteristics of the TFT.

An embodiment of the present invention provides an array substrate, which is fabricated according to the above-described fabrication method of an array substrate. It can be understood that the array substrate can also achieve the above technical effect.

Figure 11:
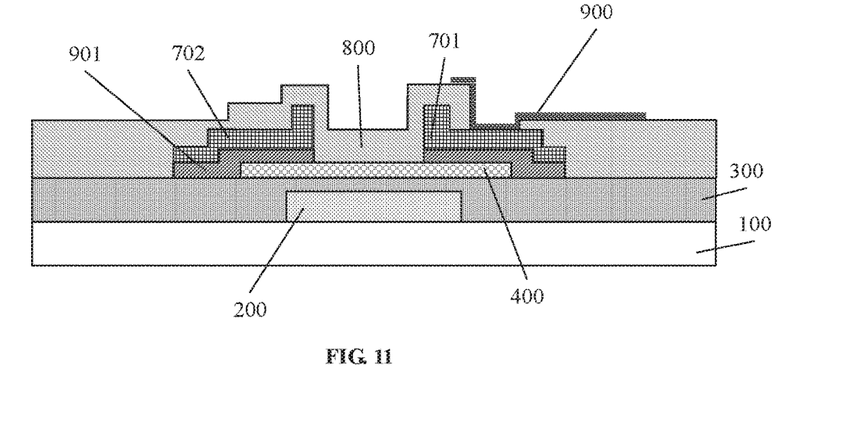
FIG. 11 is a schematic diagram of a structure of an array substrate according to an embodiment of the present invention.

An embodiment of the present invention provides a fabrication method of a TFT, which differs from the fabrication method of a TFT in the foregoing embodiments in that after the active layer 400 and the protection layer 501 are formed, an N+a-Si layer is deposited thereon by a PECVD process or the like, and a corresponding portion is removed in a subsequent process of etching the source-drain metal layer, so as to form an ohmic contact layer 901, as shown in FIG. 11. Methods for forming other film layers are the same as those described in the foregoing embodiments, and thus are not repeated here.

Figure 12:
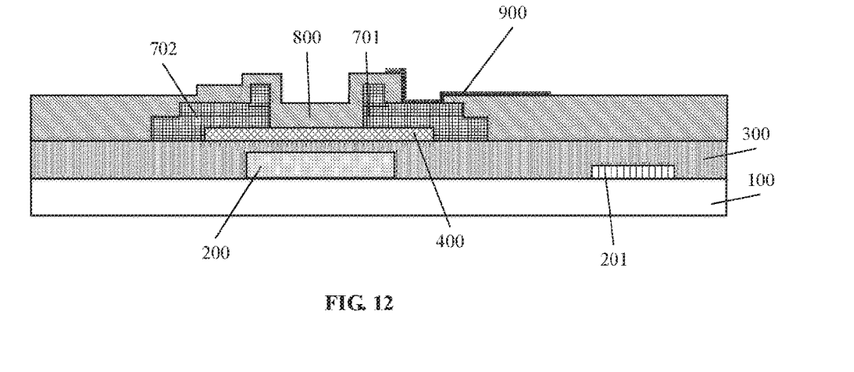
FIG. 12 is a schematic diagram of a structure of an array substrate according to an embodiment of the present invention.

An embodiment of the present invention provides a fabrication method of a TFT, which differs from the fabrication method of a TFT in the foregoing embodiments in that before the gate insulation layer 300 is formed, a transparent conductive layer 201 is deposited on the base substrate 100 by a magnetron sputtering process, a thermal evaporation process or other film forming process, as shown in FIG. 12. The transparent conductive layer 201 may include ITO or IZO, and may be a common electrode. For example, the transparent conductive layer 201 and the gate electrode 200 may be formed in a same patterning process. Other fabrication processes in the embodiment are the same as those described in the foregoing embodiments, and thus are not repeated here.

An embodiment of the present invention provides a display apparatus, which includes the array substrate in the above embodiments.

The display apparatus may be any product or component with a display function, such as a liquid crystal panel, an electronic paper, an OLED panel, a mobile phone, a tablet computer, a television, a monitor, a notebook computer, a digital photo frame, a navigator or the like.

The foregoing is only preferred embodiments of the present invention, and is not intended to limit the present invention. Any modification, equivalent replacement, improvement and the like made within the spirit and principle of the present invention should be deemed as falling within the protection scope of the present invention.

The invention claimed is:

1. A fabrication method of a thin film transistor (TFT), comprising steps of:
    forming a protection layer in an area above an active layer between a source electrode and a drain electrode to be formed;
    forming a source-drain metal layer above the active layer having the protection layer formed thereabove;
    coating a photoresist on the source-drain metal layer, and forming a photoresist reserved area and a photoresist non-reserved area, wherein the photoresist reserved area corresponds to areas of the source electrode and the drain electrode to be formed, and the photoresist non-reserved area corresponds to the other area;
    etching off the source-drain metal layer corresponding to the photoresist non-reserved area to form the source electrode and the drain electrode and expose the protection layer above the active layer; and
    removing the photoresist above the source electrode and the drain electrode and the protection layer.

2. The fabrication method according to claim 1, wherein, the protection layer is a positive photoresist or a negative photoresist.

3. The fabrication method according to claim 1, wherein, a thickness of the protection layer ranges from 3000 Å to 4500 Å.

4. The fabrication method according to claim 3, wherein, the thickness of the protection layer is 4000 Å.

5. The fabrication method according to claim 1, further comprising, before the step of forming the protection layer, a step of forming the active layer, wherein, the step of forming the active layer comprises steps of:
    forming a semiconductor layer;
    coating a photoresist on the semiconductor layer, and forming a photoresist completely-reserved area, a photoresist partially-reserved area and a photoresist non-reserved area, wherein the photoresist completely-reserved area corresponds to an area between the source electrode and the drain electrode to be formed, the photoresist partially-reserved area corresponds to the areas of the source electrode and the drain electrode to be formed above the active layer, and the photoresist non-reserved area corresponds to an area other than an area of the active layer;
    etching the semiconductor layer corresponding to the photoresist non-reserved area by an etching process; and
    removing the photoresist in the photoresist partially-reserved area by an ashing process.

6. The fabrication method according to claim 5, further comprising a step of forming an ohmic contact layer above the active layer.

7. The fabrication method according to claim 5, further comprising a step of sequentially forming a gate electrode and a gate insulation layer before the step of forming the active layer.

8. A thin film transistor fabricated according to the fabrication method according to claim 1.

9. A fabrication method of an array substrate, comprising the fabrication method according to claim 1.

10. The fabrication method according to claim 9, further comprising:
    a step of sequentially forming a gate electrode and a gate insulation layer, before the step of forming the active layer, and
    steps of forming a passivation layer on the source electrode and the drain electrode, and forming a first conductive layer on the passivation layer, after the step of removing the photoresist above the source electrode and the drain electrode and the protection layer.

11. The fabrication method according to claim 10, wherein, a second conductive layer is formed at the same time when the gate electrode is formed.

12. The fabrication method according to claim 9, further comprising, before the step of forming the protection layer, a step of forming the active layer, wherein, the step of forming the active layer comprises steps of:
    forming a semiconductor layer;
    coating a photoresist on the semiconductor layer, and forming a photoresist completely-reserved area, a photoresist partially-reserved area and a photoresist non-reserved area, wherein the photoresist completely-reserved area corresponds to an area between the source electrode and the drain electrode to be formed, the photoresist partially-reserved area corresponds to the areas of the source electrode and the drain electrode to be formed above the active layer, and the photoresist non-reserved area corresponds to an area other than an area of the active layer;
    etching the semiconductor layer corresponding to the photoresist non-reserved area by an etching process; and
    removing the photoresist in the photoresist partially-reserved area by an ashing process.

13. The fabrication method according to claim 12, further comprising a step of forming an ohmic contact layer above the active layer.

14. The fabrication method according to claim 12, further comprising a step of sequentially forming a gate electrode and a gate insulation layer before the step of forming the active layer.

15. An array substrate, wherein the array substrate is fabricated using the fabrication method according to claim 9.

16. A display apparatus comprising the array substrate according to claim 15.

17. The fabrication method according to claim 1, wherein the protection layer is formed only in the area above the active layer between the source electrode and the drain electrode to be formed.

* * * * *